United States Patent [19]

Morrison et al.

[11] Patent Number: 4,493,010
[45] Date of Patent: Jan. 8, 1985

[54] ELECTRONIC PACKAGING MODULE UTILIZING PHASE-CHANGE CONDUCTIVE COOLING

[75] Inventors: Robert A. Morrison, Granada Hills; Attila Frink, Northridge, both of Calif.

[73] Assignee: Lockheed Corporation, Burbank, Calif.

[21] Appl. No.: 439,482

[22] Filed: Nov. 5, 1982

[51] Int. Cl.³ ............................................. H05K 7/20
[52] U.S. Cl. .................. 361/385; 361/415; 165/104.33; 62/331; 62/376
[58] Field of Search .............. 165/104.33; 339/112 R, 339/112 L; 174/15 R, 17 LF; 62/434, 376, 331; 361/383, 384, 385, 387, 395, 399, 415

[56] References Cited
U.S. PATENT DOCUMENTS

| | | | |
|---|---|---|---|
| 3,043,900 | 7/1962 | Reisinger | 165/104.33 |
| 3,609,991 | 10/1971 | Chu | 174/15 R |
| 3,754,596 | 8/1973 | Ward, Jr. | 361/385 |
| 3,956,673 | 5/1976 | Seid | 361/383 |
| 4,057,104 | 11/1977 | Altoz | 165/104.33 |

OTHER PUBLICATIONS

IBM Tech. Discl. Bull., vol. 20, No. 11A, Apr. 1978, p. 4349, Aichelmann, Jr., "Three Dimensional MLC . . . Package".

IBM Tech. Discl. Bull., vol. 11, No. 9, Feb. 1969, p. 1097, Councill, "Temperature-Controlled . . . System".

Primary Examiner—G. P. Tolin
Attorney, Agent, or Firm—Louis L. Dachs

[57] ABSTRACT

Each individual module includes a sealed chamber containing the electronic components being cooled, the liquid cooling medium, and at least one minature evaporator. The evaporator's outer surface area is in direct contact with the cooling medium, so as to maintain it at a desired temperature. Preferably, in order to minimize the weight associated with the liquid cooling medium and in order to compensate for its coefficient termal expansion and the associated internal pressure variation, the chamber may be packed with resilient spheres that will displace a substantial quantity of the cooling medium without a corresponding increase in its effective viscosity (and thus without any substantial effect on the liquid's capability of transferring heat from the components to the evaporator by means of thermal convection currents). The mechanical, electrical and refrigerant connections between the module and the other assemblies of the avionics system are such that the individual module may be readily removed and replaced thereby further enchancing the overall maintainability of the system. An expansion bladder vented to the external environment may also be provided within the chamber.

12 Claims, 18 Drawing Figures

ELECTRONIC PACKAGING MODULE UTILIZING PHASE-CHANGE CONDUCTIVE COOLING

TECHNICAL FIELD

The invention relates generally to the packaging and cooling of electronic circuits and more particulary to an improved electronics packaging module in which the individual electronic components are contained in a sealed chamber containing a heat conducting liquid cooled by means of a phase-change evaporator connected to an external compressor unit.

Background Art

Electronics reliability in terms of both performance and useful lifetime is limited by the temperatures to which the individual electronic components are exposed. Traditionally, electronic assemblies such as the avionics systems of an aircraft have been convection cooled by means of refrigerated air. However, such an approach to the problem of components overheating themselves requires a considerable weight and volume of the overall system due to the ducting and heat sinks required to maintain the mean temperature differential between the components and the cooling air to an acceptable level (about 75° C. with a permitted variation for individual components of ±20° C., the variation being the result of differences in the heat loads and thermal resistances associated with the various components). Even so, for a maximum cooling air temperature of 55° (which is consistent with the specifications of many modern aircraft), then the temperatures to which many individual electronic components may be exposed will reach 150° C.

A device junction temperature of approximately 150° C. will typically have a 1,000 hour failure rate of 0.005. By way of contrast, a typical such failure rate at a junction temperature of 90° C. will be approximately 0.00005 and at 50° C. it will be 0.00002; furthermore, the slope of the failure rate as a function of the junction temperature rises dramatically in the region above 90° C. (the so-called knee of the curve at which the slope is 1).

Conventional present day avionics packaging produces approximately 5 watts of heat to be dissipated by the cooling system per circuit board; however, anticipated state-of-the-art components and circuits are expected to result in a board requiring the dissipation of in excess of 25 watts of heat as a result of increased function density. Furthermore, the ever increasing complexity of aircraft avionics systems and other similar electronic systems requires a substantial improvement in the reliability of the individual components merely to maintain the reliability of the overall system—the alternative is to further complicate the system's complexity and substantially increase the number of individual components by providing additional multiple redundancy. In any event, frequent maintenance and replacement of failed components is required in order to maintain system reliability at an acceptable level; however, the resultant necessity for repair will in turn require the demating and mating of the interface between modules and all too often introduces additional mechanical and electrical problems due to contact abrasion and misalignment caused by careless handling.

Thus it is an overall objective of the present invention to provide an improved means for cooling electronic components.

It is a more specific objective to provide a modular packaging particularly suitable for avionics applications and the like which will offer an order of magnitude improvement in circuit reliability by maintaining the maximum junction temperature of the individual electronic components to temperatures well below those associated with prior art air-cooled avionics.

It is another related objective to minimize the maximum temperature differential between the cooling medium and the individual components being cooled.

It is another related objective to integrate the cooling system into individual electronic modules which may be easily removed and replaced for test and repair purposes.

It is another object of the present invention to adapt conductive cooling techniques utilizing a liquid cooling medium to modular avionics assemblies.

It is a related objective to provide a sealed chamber for the cooling liquid to minimize adverse environmental effects.

It is another related objective to minimize the possibility of any leakage from the chamber by providing means to compensate for changes in ambient pressure and temperature.

It is another objective to physically isolate the liquid coolant from the high pressure phase-change refrigerant system to minimize the sealing forces and leakage problems within the individual modules.

It is another object to provide means for maintaining the cooling liquid at a predetermined low temperature by means of a miniature evaporator.

It is a more specific object to connect the evaporator to an external refrigeration system by means of quick-disconnect isolation valves.

It is another specific objective to minimize vapor insulation effects resulting from the nucleation of the phase-change medium within the evaporator by providing a serpentine passageway which combines an increased surface area with a reduced cross section.

DISCLOSURE OF INVENTION

The above and such other and further objects as will be become more apparent from the accompanying drawings and descriptions of presently preferred embodiments may be briefly summarized as follows:

Each conductively cooled module includes a sealed chamber containing the electronic components being cooled, the liquid cooling medium, and at least one minature evaporator. The evaporator's outer surface area is in direct contact with the cooling medium, so as to maintain it at the desired temperature. Preferably, in order to minimize the weight associated with the liquid cooling medium and in order to compensate for its coefficient termal expansion and the associated internal pressure variation, the chamber may be packed with resilient spheres that will displace a substantial quantity of the cooling medium without a corresponding increase in its effective viscosity (and thus without any substantial effect on the liquid's capability of transferring heat from the components to the evaporator by means of thermal convection currents).

The mechanical, electrical and refrigerant connections between the module and the other assemblies of the avionics system are such that the individual module may be readily removed and replaced thereby further enchancing the overall maintainability of the system. In particular, the refrigerant connections are by means of miniature quick-disconnect isolation valves and the electrical connections are by means of front panel operated zero insertion force connectors.

In an aircraft environment in which substantial changes in the pressure of the environment external to the module may be anticipated, it may also be preferable to provide an expansion bladder within the chamber that is vented to the external environment.

BRIEF DESCRIPTION OF THE FIGURES

Certain presently preferred embodiments of the invention are depicted in the figures in which.

PRESENTLY PREFERRED EMBODIMENTS OF THE INVENTION

Figure 1:
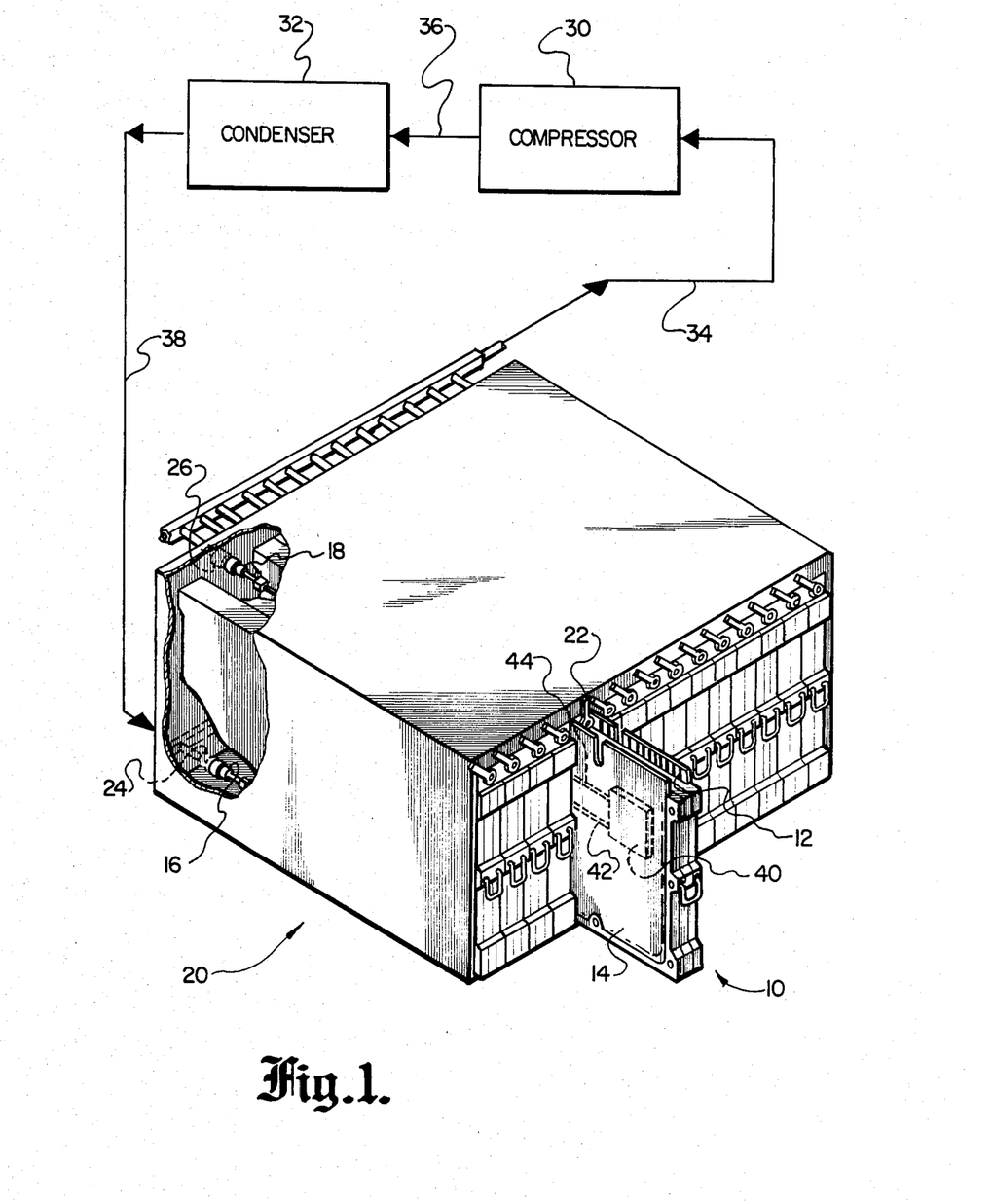
FIG. 1 is an overall schematic depiction of an avionics system packaged and cooled in accordance with the present invention.

Reference should now be made to FIG. 1 of the accompanying drawings which is a schematic diagram of one presently preferred embodiment of the invention. From this Figure it may be seen that there are provided a number of individual circuit modules (10) contained within a rack assembly (20). Each of the modules is provided with a plurality of electrical terminations (12) which may, as illustrated, be in the form of metallic traces on one surface of an etched circuit board (14). The individual modules are removably secured in sliding fashion to the rack (20) and when in their normal fully inserted positon may be secured in place by means of a latching handle (22) which also may serve to bring the contacts of a zero insertion force connector assembly (not visible) into electrical contact with the corresponding electrical terminations (12) defined on a circuit board edge extending from the individual module, lifting the said contacts away from the circuit board traces prior to the module being slid to its removed position, thereby avoiding any possible mechanical interference or abrasion between the contacts while the module is being removed from or installed into its normal operative position with the rack. At least one such zero insertion force connector is provided for each individual module (10). The individual such connectors are interconnected to one another and to the external electrical systems with which the rack (20) interfaces by means of a conventional mother board or the like. At the rear of the rack (20), there are provided a plurality of quick-disconnect refrigerant couplings, including an inlet coupling (24) and an outlet coupling (26). These couplings connect with corresponding quick-disconnect fittings (16 and 18) provided at the rear of each individual module (10).

External to the rack (20) there is provided a conventional refrigeration system compressor (30) and a conventional refrigeration system condenser (32). Appropriate refrigerant lines (34, 36, and 38) respectively connect the rack's outlet couplings (26) with the inlet to the compressor (30), the outlet of the compressor (30) to the inlet of the condenser (32), and the outlet of the condenser (32) to the rack's inlet couplings (24).

As indicated in dashed outline, within an internal chamber of each individual module (10), there is provided a miniature evaporator (40) with an inlet line (42) and an outlet line (44) connecting the evaporator (40) respectively with the module's inlet fitting (16) and its outlet fitting (18). Thus the compressor (30), the condenser (32), the evaporator (40) and the associated refrigerant lines and fittings function as a conventional phase-change refrigeration system in which a suitable refrigerant (such as Freon) is recirculated through a closed loop. In particular, the Freon is first compressed by the compressor (30) and cooled by the condenser (32) to produce a cool liquid that remains in its liquid phase until it has entered the evaporator (40), at which point it is expanded into a vapor phase and absorbs energy in the form of heat. The warm vapor then flows to the compressor (30) and the cycle is repeated.

Figure 13:
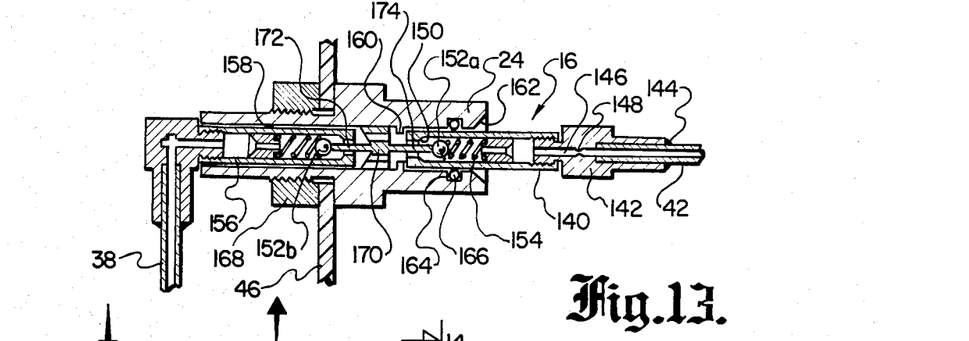
FIG. 13 is a cross-section view through the disconnect fitting of FIG. 12.
Figures 16, 17, 18:
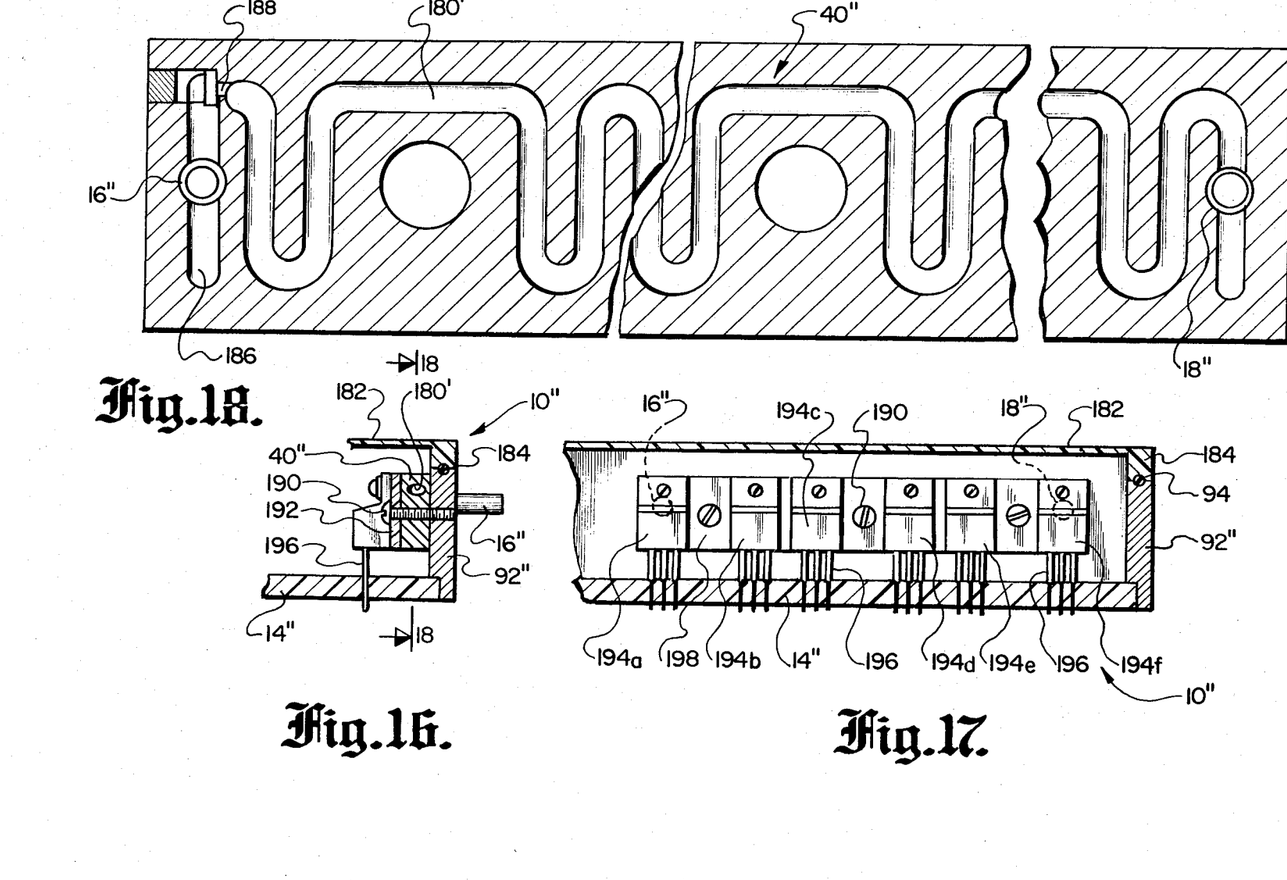
FIG. 16 is an end elevational view of a second embodiment of an evaporator for use with the present invention.
FIG. 17 is an interior end elevational view of a module containing the evaporator of FIG. 16.
FIG. 18 is an enlarged cross-section through the interior of the evaporator of FIGS. 16 and 17.

It will be appreciated that by using a phase-change refrigerant such as Freon, a considerable quantity of heat can be removed from the various modules within the avionics rack assembly (20); furthermore, by appropriately sizing the individual lines (42, 44) (or as discussed hereinafterwards in reference to the specific embodiments of FIGS. 13 and 18, by appropriate sizing of flow control orifices), the individual evaporators (40) may all be maintained within a few degrees of the temperature at which the phase-change occurs. In addition, it will be appreciated that such a refrigeration system can be hermetically sealed and otherwise will be well able to function reliably within the type of environment found within the avionics compartment of an aircraft. It should also be appreciated that a relatively low flow rate of the refrigerant will normally be required.

Figure 14:
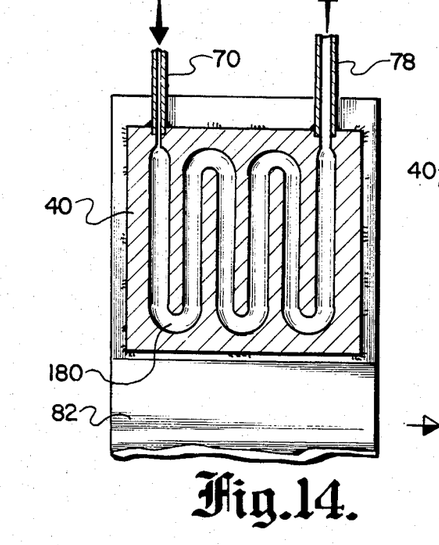
FIG. 14 is a cross-section through one embodiment of a miniature evaporator for use with the present invention.
Figure 15:
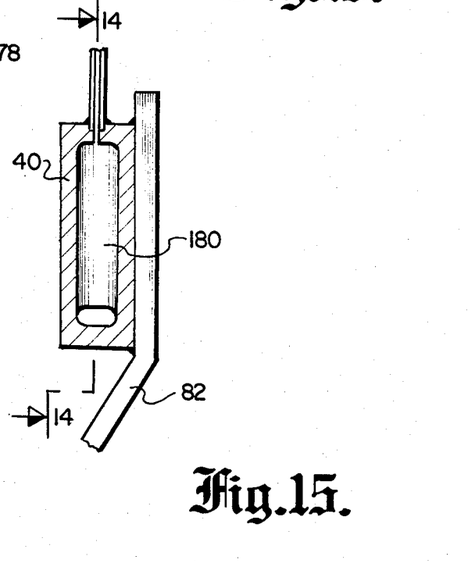
FIG. 15 is another cross-section through the evaporator of FIG. 14 shown taken at right angles thereto.

By way of example, a miniature evaporator of the type shown in FIGS. 14 and 15 has been experimentally shown to be capable of a heat removing capability in excess of 120 watts with a flow rate of the commercial F-22 Freon refrigerant of only 1.2 gallons per hour (4.5 liters/hr.), without exceeding a temperature of 30° C. at the surface of the evaporator. Thus, it may be seen that even by utilizing a conventional refrigeration compressor and other commercially available components, there may be a considerable savings in bulk and associated weight of the overall system as a result of the elimination of the large air ducts and cooling fins associated with air-cooled avionics.

It was stated previously that at an electronic device junction temperature of 50° C., a typical 1,000 hour failure rate will be 0.00002; assuming that the individual evaporator (40) will be maintained at or below a 30° C. temperature, then the temperature differential between the individual electronic devices contained within the module (10) and the individual evaporator (40) also contained within the module should be held below 20° C. in order to ensure a maximum junction temperature of 50° C. In accordance with the teachings of the present invention, this desired objective can be readily obtained by making the individual module (10) such that the individual electronic components and the associated refrigerant evaporator (40) are contained within a sealed chamber which is filled with a inert liquid coolant such as the flourocarbon compound obtainable commercially under the trademark "Flourinert 77" (also known as "FC-77"). The FC-77 "wets" the surfaces of the electronic components and of the evaporator so as to facilitate the transfer of heat to and from the liquid coolant; thermal conduction and convection currents within such a liquid coolant medium will transfer the heat generated by the various electronic components to the evaporator with only a relatively small temperature differential.

Figures 2, 3:
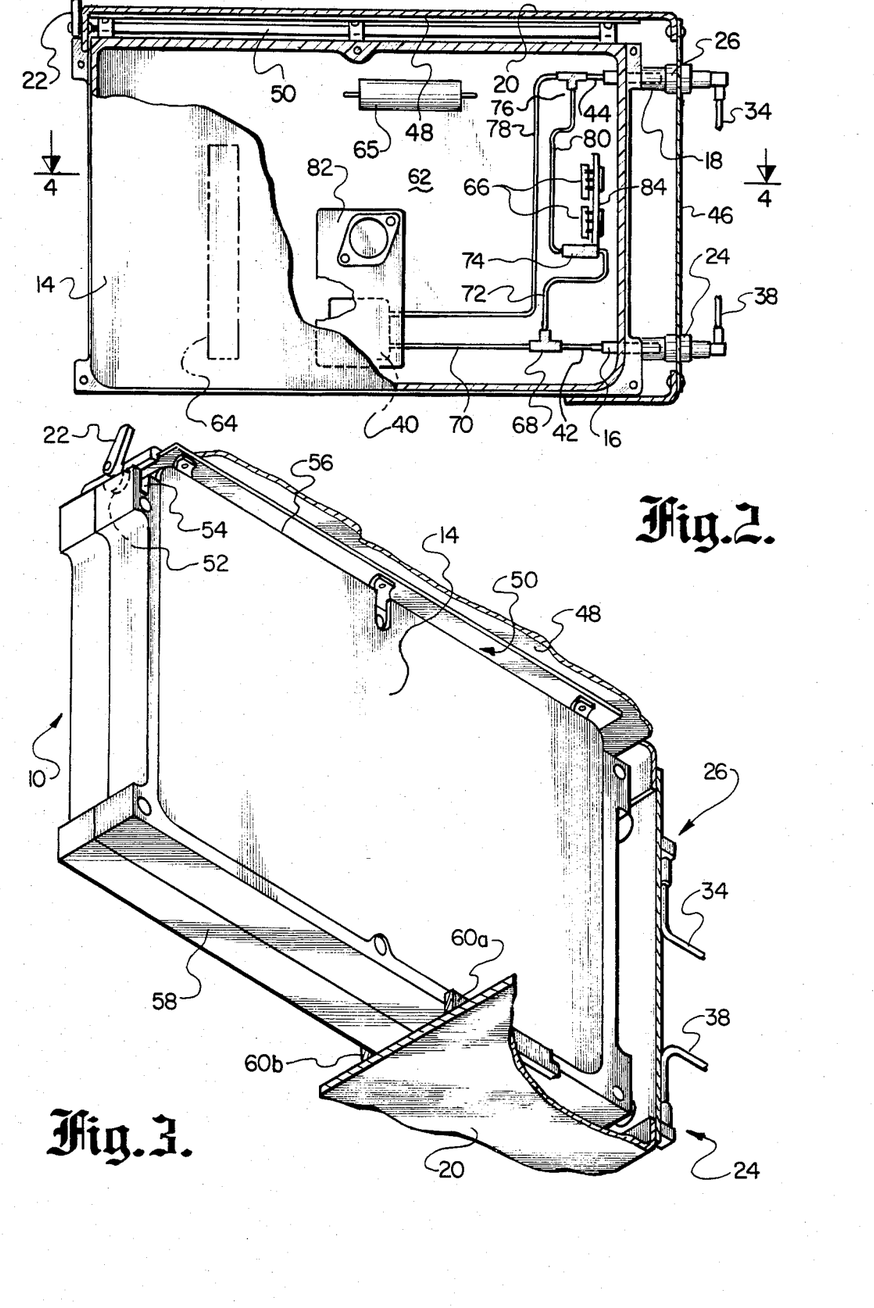
FIG. 2 is a side elevational view of a portion of FIG. 1 showing a particular circuit module within the mounting rack but partially cut away to better show certain of the cooling subsystem components.
FIG. 3 is an isometric view corresponding generally to FIG. 2 but looking from below.

Reference should now be made to FIGS. 2 and 3 which are, respectively, side elevational and isometric views of a typical avionics module constructed in accordance of the teachings of the present invention in its normal operative position within the rack (20) with its respective inlet, and output disconnect fittings (16 and 18) inserted into the appropriate couplings (24, 26) mounted in manifold fashion to the rear wall (46) of the rack. Also visible in FIG. 2 is the motherboard (48) to which the zero insertion force connector (50) is attached so as to effect the electrical connections between the various layers of the motherboard (48) and the corresponding particular electrical terminals (12) extending from the printed circuit boards (14a, 14b) which form the respective left and right sides of the individual module (10). When the handle (22) is in its locked position as shown with its projecting cam (52) in mechanical engagement with a corresponding slot (54) machined at the upper front end of the module (10), the module (10) is secured mechanically in its operative position. The upper end of the module (comprising four upwardly projecting extensions (56) of the side circuit boards (14)) is located in position with respect to the rack (20) and the motherboard (48) by means of the electrical connector (50) as foresaid (50). The lower portion (58) of the module (10) is maintained in its proper lateral position by means of a pair of guides (60a, ) 60b), attached to the inside lower surface of the rack (20). From the partially cut-away view of FIG. 2, it may be seen that within the module (10) there is provided a chamber (62) containing various electronic components and integrated circuits mechanically and electrically connected to the circuit boards (14), with integrated circuits being shown symbolically at reference numeral (64) and discrete electronic components such as shown symbolically at reference numbers (65 and 66). The inlet refrigerant line (42) leading from the male quick-disconnect inlet fitting (16) is connected to a T-fitting (68) from which the inlet refrigerant line (42) branches into feeder lines (70 and 72) leading respectively to a first miniature evaporator (40) and a second evaporator (74).

In a similar fashion, the refrigerant outlet line (44) leading to the outlet quick-disconnect fitting (18) is provided with a separate T-fitting (76) joining the respective outlet lines (78 and 80) from the first and second evaporators (40, 74). It will be appreciated that such a form of construction minimizes the sealing problems associated with the chamber (62) by physically isolating the liquid coolant contained therein from the high-pressure refrigerant system, so that the chamber (62) may be maintained at approximately the same pressure as the external environment.

The first evaporator (40) is not directly attached to any electrical component, but is provided with a copper cooling fin (82) which greatly increases the effective surface area of the evaporator and thus further reduces the differential temperature between the inert liquid coolant contained within the chamber (62). As shown in FIG. 2, the second miniature evaporator (74) includes an integral heat sink (84) on which the two electronic components, such as power diodes, (66) are mounted, so as to reduce the amount of heat which the inert liquid coolant is required to convey between the individual components and the evaporators. Such a direct mechanical mounting of a particular component (such as a power diode that generates a large quantity of heat) to a physical extension of the evaporator will not normally be required, but is advantageously employed in certain modules (10) such as power supplies that may be expected to generate substantial quantities of heat.

Figure 4:
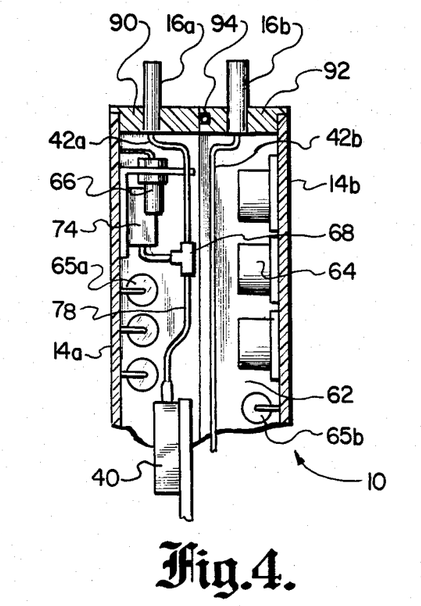
FIG. 4 is a top cross-sectional view of the inner portion of the module of FIGS. 2 and 3.

Referring specifically to FIG. 4 which is a cross-sectional view through the module (10) as indicated by the arrows 4—4 in FIG. 2, it may be seen that the peripheral walls (90, 92) associated respectively with the left and right circuit board side walls (14a and 14b) form a pair of shallow containers which, when assembled with the projecting portions of their peripheral walls (90, 92) abutted against each other and sealed by means by an appropriate O-ring seal (94) as indicted in the figure, defines the seated liquid-tight internal chamber (62) containing the aforesaid electronic components and circuit subassemblies (64, 65, 66).

Figure 5:
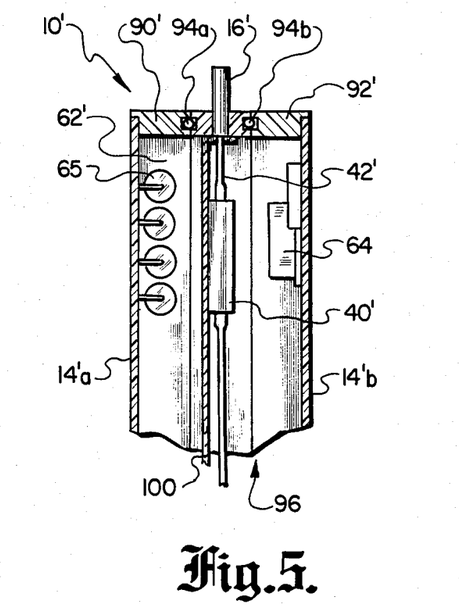
FIG. 5 is a partially cut away top cross-sectional view generally corresponding to FIG. 4 but showing an alternative embodiment.

Reference should now be made to FIG. 5 which corresponds generally to the cross-sectional view of FIG. 4, but shows an alternative embodiment of the module (10).

The embodiment of FIG. 5 differs from that shown in FIG. 4 primarily in that the module (10') comprises three separate portions, namely left-hand side board (14a') and an upstanding peripheral wall (90'), a right-hand portion comprising a right-hand circuit board (14b') and a right-hand peripheral side wall (92') and a central portion (96) comprising a central peripheral wall (98) and a central cooling fin (100) to which is attached a miniature evaporator (40') leading to the external refrigeration system by means of the miniature refrigerant lines (42') and quick-disconnect refrigerant coupling (16'). The embodiment of FIG. 5 has the particular advantage that the refrigeration components associated with an individual module (10') are physically and electrically separate from the electrical components, thus, in the event of an electrical failure within a particular module, the module is merely separated into its three major subassemblies, the left-hand electrical subassembly 14a, 90'), the central refrigerant assembly (96) and the right-hand electrical subassembly (14b', 92'); the defective subassembly then is repaired or replaced and the module again assembled, with there being no requirement to in any way disturb or replace any of the refrigerant lines (42') or evaporators (40') contained in the central portion (96). Alternatively, in the event of a suspected malfunction of the refrigerant subassembly included within the central portion (96) of the module (10'), the module may be disassembled into its three component subassemblies without any electrical connections being disturbed.

Figures 6, 7, 8:
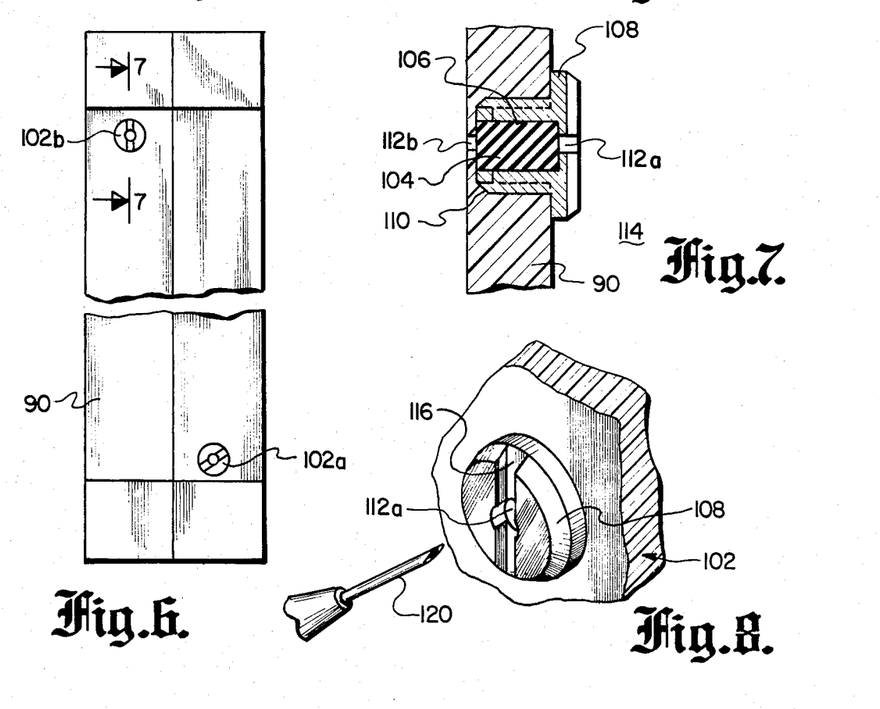
FIG. 6 is an end elevational view of a typical module showing the plugs by means of which the module is initially filled with liquid coolant.
FIG. 7 is a side cross-sectional view through one of the filling plugs of FIG. 6.
FIG. 8 is an isometric view of a filling plug about to be penetrated by a hypodermic needle.

It will be appreciated that in order to facilitate the assembly and maintenance of the individual modules (10, 10') means should be provided to introduce the liquid coolant medium into the chamber (62, 62') and to permit any trapped air or other gas within the chamber (62, 62') to be vented during the filling process. FIGS. 6, 7, and 8 are detailed drawings of one such means as provided in one or more of the peripheral end walls (90, 90' etc). Such a fitting (102) comprises a rubber insert (104) compressed within an enlarged bore (106) defined by the inner diameter of a hollow plug (108) screwed into an appropriate recess (110) in the module's peripheral wall (90). A small diameter bore (112a), is provided in the center of the plug (108) and a corresponding small bore (112b) coaxially aligned therewith is provided at the bottom of the recess (110) such that the rubber insert (104) blocks internally what would otherwise be a open passageway leading from the interior chamber (62) to the external environment (114). The plug (108) is also provided with a screwdriver slot (116) by means of which the plug (108) may readily be installed into the recess (110). As indicated in FIG. 8, the dimension of the small bores 112a, 112b) is such that a hypodermic needle may be inserted into the passageway defined by the outer and inner small bores (112a, 112b), penetrating in the process the rubber insert (104) and thereby permitting liquid coolant to be introduced into the chamber (62) through the lower filling means (102a). A second hypodermic needle (120) can be inserted into the upper vent means (102b) to allow the trapped air, gas, etc., within the chamber (62) to be vented to the external environment (114).

Figures 9, 10, 11:
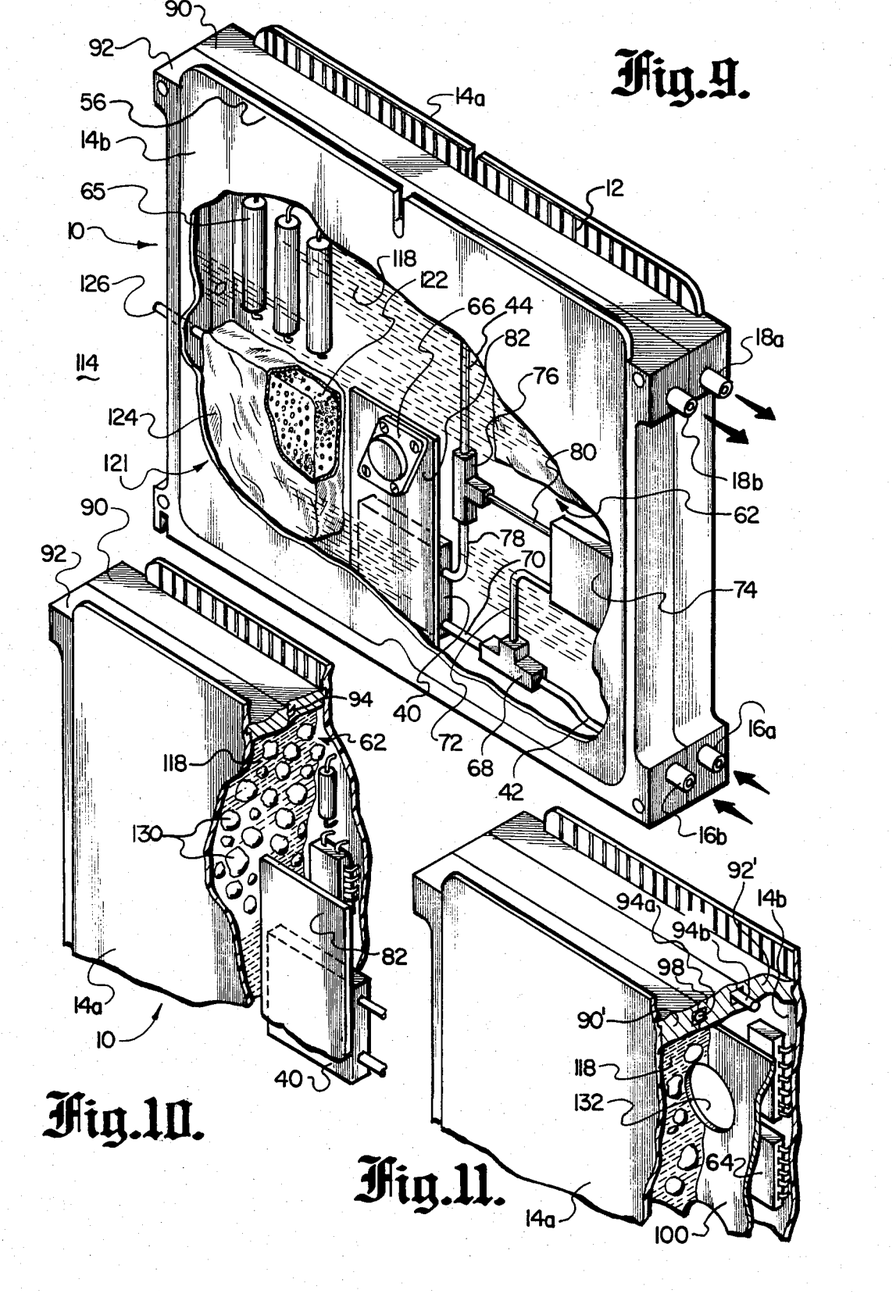
FIG. 9 is an isometric view of a typical module shown in FIG. 1, partially cut away to show the spatial and functional relationships between the electronic components, the miniature evaporators, the liquid cooling medium and a volume compensating vented bladder contained within the module.
FIG. 10 is an isometric view of a portion of another type of typical module in which the internal chamber has been packed with resilient spheres to displace a substantial part of the cooling medium.
FIG. 11 is an isometric view of a portion of a cooling module constructed in accordance with an alternative embodiment of the invention similar to that shown in FIG. 5.

Reference should now be made to FIGS. 9, 10 and 11 which illustrate various means for compensating for volumetric expansion of the coolant medium as the mean temperature inside the interior (62) of the module (10) is increased. Referring first of all to FIG. 9 (which illustrates a typical module such as has been described in detail previously with respect to FIGS. 2 through 4), it should be observed the module (10) is provided with a pair of inlet quick-disconnect refrigerant fittings (16a and 16b) and with a corresponding pair of outlet fittings (18a and 18b). By this means, each of the two subassemblies that together form a single module (10) namely, the left-hand subassembly (comprising the left-hand circuit board panel (14a) and the left-hand peripheral frame (90)) and the right-hand subassembly (comprising the right-hand panel (14b) and the right-hand peripheral frame (92)) is provided with its corresponding evaporators (40), inlet refrigerant lines and fittings (42, 68, 70, 72), and outlet refrigerant lines and fittings (44, 76, 78 and 80). It will be appreciated that by so providing two separate and independent refrigerant evaporator circuits within the module, it will thus be possible to further enhance the reliability of the avionics system by providing a redundant cooling capability merely by providing a second set of compressors (30), condensors (32) and connecting lines (34, 36, and 38), such that a single failure in any refrigeration component will not be catastrophic to the cooling of the components (64, 65, 66) contained within a particular module.

Still referring particularly to FIG. 9, it will be seen that the chamber (62) of the module (10) has been filled with the above-described liquid coolant medium (118); furthermore, a portion of the chamber (62) unoccupied by any of the electronic components has been filled by a vented expansion bladder (121) having a soft, porous core (122) covered by an impervious but flexible latex skin (124), the interior of the expansion bladder being vented to the external environment by means of a vent (126) passing through the peripheral wall (92) of the module (10).

It has been found that if the volume of such an expansion bladder (121) is only 10% that of the volume of the liquid (118), then pressure increases caused by the relatively high co-efficient of thermal expansion (0.08% volume per °C) will result in a pressure differential of at most 5 lbs./sq. in. (0.35 kg/cm$^2$)—a relatively slight pressure differential that may be easily maintained by means of conventional adhesive sealing between the circuit boards (14a, 14b) and the peripheral frames (92, 90) and by a conventional compressed O-ring seal (94) between the individual subassemblies.

Reference should now be made to FIG. 10, which is a view generally similar to that of FIG. 9 but shows a plurality of more or less spherical bodies (130) inside the chamber (62) for displacing a substantial volume of the coolant liquid (118). The construction of the formidable spheres (130) may be generally similar to that of the expansion bladder (121), namely, a relatively soft, compressable inner core formed from foam latex or other similar light-weight, porous material covered with an impervious latex skin. It has been found that by filling the chamber (62) with its maximum capacity of such spheres having a diameter of about ¼ in. results in only a 5% reduction in cooling capability but, nevertheless, displaces a considerable volume (i.e., almost 50%) of the FC-77 coolant. Since the density of FC-77 is 123 lbs./cu. ft. (2.0 g/cm$^3$) it will be appreciated that this represents a considerable weight savings.

Preferably a vented bladder (such as that shown at (121) in FIG. 9) is combined with a quantity of smaller filler material (such as the foam spheres (130) in FIG. 10), with the vented expansion bladder (121) providing the additional advantage of compensating for variations in pressure of the external environment (114) that might otherwise result in a greater differential pressure between the external environment (62) and the pressure of the liquid (118) within the internal chamber (62), while the spheres (130) may be used to pack randomly shaped open spaces within the chamber (62).

FIG. 11 illustrates the same principle described previously with respect to FIGS. 9 and 10 but adapted to the alternative three-section embodiment of FIG. 5. In particular in this FIG. it will be noted that the central cooling fin (100) is provided with a plurality of large openings (132) which not only enhances the convection currents within the cooling liquid (118) but also facilitates the packing of the chamber (62) with the filler spheres (130).

Figure 12:
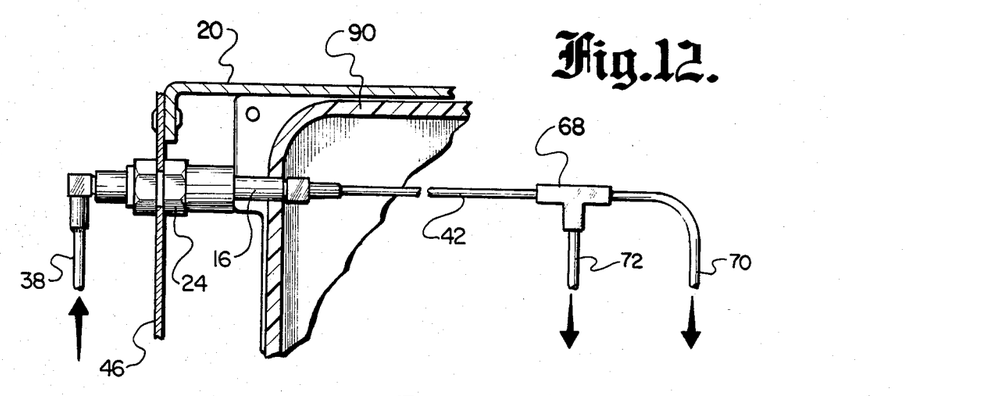
FIG. 12 is a cross-section view of a portion of the structure shown in FIG. 2 detailing the quick-disconnect fitting provided in the refrigerant line between the module and the supporting rack.

Reference should now be made to FIGS. 12 and 13 which are enlarged plane and cross-sectional views of the quick-disconnect fittings (16, 18, etc.) which provide the interface between the refrigerant lines (42, 70, 72, etc.) internal to the module (10) and the lines (34, 36, 38) that are provided between the external rack (20) and the external refrigeration components (30, 32). In particular, the fitting (16) is provided with an internal threaded portion (140) at one end which mates with a termination fitting (142) secured at one end of the internal refrigerant line (42) by means of brazing (144), the fitting (142) being provided with an internal passageway (146) having a restricted orifice portion (148) which will regulate the volume of refrigerant flowing through the individual module (10). The other end of the fitting is provided with an internal reduced diameter seat (150) against which a spherical check valve element (152a) is normally biased by means of a compression spring (154) so as to provide a spring-loaded check valve that will seal the end of tubing (42) against any loss of refrigerant contained therein when the fitting (16) is withdrawn from the coupling (24). The coupling (24) contains a check valve portion (156) essentially identical to the aforementioned fitting (16), the check valve (156) being secured within a large internal bore (158) provided with an inwardly projecting retainer portion (160) and an outwardly flared portion (162), as well as with an internal groove (164) with which is located an O-ring seal (166). The function of the outwardly flared portion (162) is to guide the end of the fitting (162) into the aforementioned bore (158) until it rests against the inward abutment (160), with the outer surface of the fitting (16) being sealed with respect to the bore (158) by means of the O-ring seal (166). A nut (168) secures the fitting (24) against the rear wall (46) of the rack assembly (20) so that as the module (10) is slid rearwardly into its operative position, being guided by the tracks (16a, 16b) and connector (50), the fitting (16) will be coaxially oriented with respect to the coupling (24) such that it readily enters the bore (158) until it reaches the position shown in FIG. 13. After the fitting (16) has penetrated the bore (158) beyond the O-ring groove (164) and the O-ring seal (166) contained therein, thereby effecting a gas-tight seal between the fitting (16) and the coupling (24), a poppet assembly (170) having a pair of projecting pins (172, 174) forces the two respective spherical check valves (152a, 152b) away from the valve seat (150) and thereby opens a continuous fluid passageway from the external piping (38) to the internal piping (42). The inward abutment portion (160) of the bore (158) also functions to retain the poppet assembly (170) within the coupling (24) so that it does not become lost or damaged, with the location of the abutment (160) with respect to the check valve assembly (156) within the female coupling (24) being such that the valve member (152b) is biased into its closed position against its seat until the proper fitting (16) has been fully inserted into the coupling's bore (158).

FIGS. 14 and 15 are enlarged cross-sectional views in top and end elevation of a typical miniature evaporator assembly that may be contained within the chamber (62) of module (10) such as the first evaporator (40) described above with reference to FIG. 2. From FIG. 14 it may be seen that the internal diameter of the inlet tubing (70) leading to the evaporator (40) is somewhat less than the corresponding diameter of the outlet tubing (78). It will be recalled that in normal operation the refrigerant enters the evaporator (40) as a liquid, undergoes a phase-change within the evaporator and exits therefrom as somewhat warmer vapor. As a consequence, although the mass flow into the evaporator will be identical to the mass flow therefrom, it is preferable to compensate for the increased volumetric flow in the outlet line (78) by increasing its cross-section and thereby avoiding extreme increases in flow rate that could result in excessive back pressure. Within the evaporator (40) there is provided an enlarged serpentine passageway (180) in which the refrigerant liquid may undergo the above-described change of phase and thus absorb the heat of vaporization from the surrounding liquid coolant (118) (see FIG. 9) via the surface of the evaporator and/or the cooling fin (82) in contact therewith. By making the passageway serpentine, its effective internal length and surface area may be significantly greater than the corresponding external dimensions of the evaporator. Furthermore, by additionally providing a relatively small cross-sectional area for the flow of the refrigerant through the evaporator, the insulative effects of any nucleated refrigerant adhering to the walls of the passageway will be reduced by the scrubbing action of the resultant high velocity flow of the liquid.

Reference should now be made to FIGS. 16, 17 and 18 which illustrate a second embodiment of a miniature evaporator for use with the present invention particularly suitable for a module in which a few relatively small components generate a large percentage of the total heat that is required to be dissipated. In this embodiment it will be seen that the circuit board (14) forms one side of the completed module (10") and the other side is formed of a metal sheet (182) welded or brazed to a relatively low peripheral wall (184) which abutts against the upstanding end (92") located about and adhesively sealed to the circuit board (14"). A pair of male quick-disconnect fittings (16", 18") function as the respective inlet and outlet fittings to the connector and are essential identical to those described previously with reference to FIGS. 12 and 13. However, rather than being screwed to a termination fitting on the end of miniature tubing (42) as shown in FIG. 13, they are screwed directly to a modified evaporator (40") shown in a detailed cross-sectional plan view in FIG. 18.

Referring specifically to FIG. 18, it may be seen that the inlet fitting is in communication with an inlet manifold passageway (186) at one end of the modified evaporator unit (40") which communicates via a flow control orifice (188) with a serpentine extension chamber (180') leading to an outlet manifold portion communicating with the outlet fitting (18"). The modified evaporator (40") is attached directly to the rear wall (92') of the module by means of appropriate fasteners (190). Directly above the inwardly facing surface of the modified evaporator (40") and in contact therewith is provided a spacer (192) on which are mounted a plurality of power transistors or other heat generating electronic components (194a, 194b, etc.). Each of the individual electronic components (194a, etc.) is provided with corresponding electrical leads (196) physically and electrically attached to corresponding printed circuit traces on the inner surface of the circuit board (14″).

The spacer (192) is preferably formed of aluminum with a ceramic electrically insulating surface film so that the individual electronic components (194a, 194b, etc.) are electrically isolated from one another and from the metallic surface of the evaporator unit (40″), but which nevertheless provides a highly conductive thermal path so that relatively large quantities of heat may be dissipated by the Freon flowing within the serpentime path (180′) within the evaporator (40″). The exposed areas of the spacer (192) (such as indicated by reference numeral (198) in FIG. 17) will provide a relatively large surface area in contact with the liquid coolant medium (118) which in turn will cool the other electronic components (64, 65, 66) within the module (10″) mounted to the circuit board side panel (14″) by means of liquid convection currents.

What is claimed is:

1. An electronics packaging assembly comprising in combination:
   a plurality of circuit board modules each comprising:
   a housing having a chamber therein;
   an inlet refrigerant fitting coupling the exterior of said module to said chamber, said inlet fitting having an inlet line extending into said chamber;
   an outlet refrigerant fitting coupling the exterior of said housing to said chamber, said outlet fitting having an outlet line extending into said chamber;
   a plurality of electronic components within said chamber;
   electrical termination means external to said module for making electrical connection to said electronic components inside said chamber;
   an evaporator within said chamber, said evaporator being connected to said inlet line and said outlet line within said chamber;
   an inert coolant liquid contained inside said chamber in surface contact with said electronic components and with said evaporator so as to facilitate the transfer of heat therebetween; and
   means for retaining said liquid inside siad chamber;
   whereby when a compressed refrigerant liquid is introduced into said module via said inlet fitting, it may experience a change of phase within said evaporator and thereby absorb heat from said evaporator and the surrounding portion of said coolant liquid in surface contact therewith so as to maintain said coolant at a first temperature within a predetermined first temperature range which in turn will result in said electronic components being maintained within a predetermined second temperature range related to said first temperature by a predetermined differential temperature range;
   a refrigeration compressor;
   a refrigeration condensor;
   a rack for holding said modules;
   a plurality of inlet couplings attached to said rack;
   a plurality of outlet couplings attached to said rack;
   a plurality of external refrigerant lines respectively connecting said outlet couplings to said compressor, said compressor to said condensor, and said condensor to said inlet couplings;
   a plurality of electrical connectors secured to said rack, at least one of said connectors being provided for each of said modules; and
   means for removing a particular one of said modules from a first position wherein said inlet fitting of said particular module is in gas-tight connection with a corresponding one of said inlet couplings, said outlet fitting of said particular module is in gas-tight connection with a corresponding one of said outlet couplings, and said electrical termination means of said particular module is in electrical connection with a corresponding one of said electrical connectors to a second position wherein there is no fluid connection between said module and said external refrigerant lines and no electrical connection between said module and said electrical connectors.

2. The assembly of claim 1 wherein at least one said evaporator is provided with a cooling fin for increasing the effective surface area of said evaporator to thereby increase the rate of heat transfer between said coolant liquid and said evaporator.

3. The assembly of claim 1 wherein at least one of said modules further comprises at least one heat generating electronic component mechanically mounted to its said evaporator so as to provide a highly conductive path for conducting heat from its said component to said evaporator independently of its said coolant liquid.

4. The assembly of claim 3 wherein an electrically insulating but thermally conductive spacer is provided between said heat generating electronic component and said evaporator of said at least one module.

5. The assembly of claim 1 wherein each of said modules further comprises enclosing means for additionally defining and sealing its said chamber and for permitting said each module to be disassembllled into a first subassembly comprising said wall and a second subassembly comprising said enclosing means, whereby access may be had to said electronic components, said refrigerant lines and said evaporator within its said chamber.

6. The assembly of claim 5 wherein said each module is additionally provided with means for introducing said coolant liquid into its said chamber and for venting air and gas within the chamber to the external environment after said first and second subssemblies have been assembled.

7. The assembly of claim 5 wherein at least one of said modules further comprises within its said chamber a compressible body for displacing an equivalent volume of the liquid coolant that would otherwise be required for filling such chamber, said compressible body having a lighter specific weight than said liquid coolant.

8. The assembly module of claim 7 wherein the interior of said compressible body is vented to the environment external to said at least one module by means of a vent passing through its said wall.

9. The assembly of claim 5 wherein said enclosing means comprises a second wall in an abutting relationship with said first wall of the module.

10. The assembly of claim 9 wherein at least one of said modules further comprises within its said chamber an inert body for displacing an equivalent volume of the coolant liquid that would otherwise be required for filling such chamber, said compressible body having a lighter specific weight than said liquid coolant.

11. The module of claim 9 wherein said inlet and outlet fittings of at least one of said modules are mechanically secured to its said first wall and wherein its said electrical termination means is mechanically secured to its said second wall, whereby any failure in said refrigerant lines or in said evaporator within said at least one module may be repaired by replacing only its said first subassembly and whereby an electrical failure of any component electrically connected to said termination means may be reparied by replacing only its said second subassembly.

12. The assembly of claim 1 wherein said inlet and outlet fittings are quick-disconnect isolation valves.

* * * * *